United States Patent [19]

Hiramoto et al.

[11] Patent Number: 4,704,346

[45] Date of Patent: Nov. 3, 1987

[54] PROCESS FOR THE EXPOSURE OF SEMICONDUCTOR WAFER

[75] Inventors: Tatsumi Hiramoto, Tokyo; Ikuo Iwai; Masachika Ohyama, both of Himeji; Mitsuo Narita, Takasago, all of Japan

[73] Assignee: Ushio Denki Kabushiki Kaisha, Tokyo, Japan

[21] Appl. No.: 868,690

[22] Filed: May 30, 1986

[30] Foreign Application Priority Data

Jun. 28, 1985 [JP] Japan ................................ 60-140245

[51] Int. Cl.$^4$ .................... G03C 5/00; H01J 61/16; H01J 61/20
[52] U.S. Cl. .................................... 430/311; 313/571; 313/639; 313/642
[58] Field of Search ................. 313/571, 639, 642; 430/311, 494

[56] References Cited

U.S. PATENT DOCUMENTS

| | | | |
|---|---|---|---|
| 2,707,247 | 4/1955 | Anderson, Jr. | 313/571 |
| 2,821,647 | 1/1958 | Rigden | 313/571 |
| 4,215,935 | 8/1980 | Loebach | 355/67 |
| 4,606,997 | 8/1986 | Kira | 430/311 |

OTHER PUBLICATIONS

Elenbaas et al, High Pressure Mercury Vapor Lamps and Their Applications, N. V. Philips, The Netherlands, 1965.

"Introduction to Microlithography", edited by Thompson et al, pp. 20–27, 1983.

*Primary Examiner*—John E. Kittle
*Assistant Examiner*—José G. Dees
*Attorney, Agent, or Firm*—Robert F. Ziems

[57] ABSTRACT

A semiconductor wafer can be exposed by arranging a combination of electrodes in an opposed relation with an interelectrode distance of not more than 15 mm in a closed discharge cavity, enclosing, within the cavity, mercury as a light-emitting discharge component in an amount such that the vapor pressure of mercury reaches 0.4–5 atms during discharge lighting, forming a discharge between the combination of electrodes while controlling the discharge current at not less than 10 A, and irradiating light, which has been radiated as a result of the discharge and contains at least one of light components having wave-lengths of 405 nm and 436 nm respectively, onto the surface of a photoresist applied on the semiconductor wafer through a photomask or reticle and a lens which permits transmission of the light having wavelength of 405 nm or 436 nm therethrough.

3 Claims, 6 Drawing Figures

PROCESS FOR THE EXPOSURE OF SEMICONDUCTOR WAFER

BACKGROUND OF THE INVENTION (1) Field of the Invention

This invention relates to a proces for the exposure of a semiconductor wafer, which is suitable for practice in the fabrication process of a semiconductor devices.

(2) Description of the Prior Art

The wavelength of light employed for the exposure of semiconductor wafers in the early years around 1965 was approximately 436 nm as typified by light radiated from a global supervoltage mercury vapor lamp which may also be called a short arc lamp. As time went on toward 1970 and further, the integration of IC devices proceeded significantly. It is recently required to effect exposure at a resolution as high as 1 μm or even higher. Reflecting this, light of wavelengths ranging from 200 nm to 250 nm have now found utility in the exposure of semiconductor wafers (see, KIRA U.S. Pat. No. 5,190,786 and Japanese Patent Laid-Open No. 108478/1979).

It has however been known that as the wavelength of exposing light becomes shorter, more and more limitations are imposed on optical materials usable in an optical system and the exposing apparatus becomes more expensive. For these limitations, exposure of semiconductor wafers is still conducted using light of wavelengths ranging from 400 nm to 450 nm, although it is not expected to achieve any resolution as high as 1 μm or even higher from the use of such light. Conventional global supervoltage mercury vapor lamps have however been pointed out to involve such drawbacks that they do not permit any further reduction of the effective pulse width at half maximum in their spectra and they are also susceptible to breakdown.

SUMMARY OF THE INVENTION

With the foregoing in view, the present invention has as its object the provision of a novel process for the exposure of a semiconductor wafer with light, the spectrum of which has a small effective pulse width at half maximum, while minimizing the danger of breakdown of a light source.

In one aspect of this invention, there is thus provided a process for the exposure of a semiconductor wafer, which comprises:

(a) arranging a combination of electrodes in an opposed relation with an interelectrode distance of not more than 15 mm in a closed discharge cavity;

(b) enclosing, within the cavity, mercury as a light-emitting discharge component in an amount such that the vapor pressure of mercury reaches 0.4–5 atms during discharge lighting;

(c) forming a discharge between the combination of electrodes while controlling the discharge current at not less than 10 A; and (d) irradiating light, which has been radiated as a result of the discharge and contains at least one of light components having wavelengths of 405 nm and 436 nm respectively, onto the surface of a photoresist applied on the semiconductor wafer through a photomask or reticle and a lens which permits transmission of the light having wavelength of 405 nm or 436 nm therethrough.

Since patterns such as IC patterns are transferred to the surface of the photoresist by means of the light, the present invention can bring about such advantages that semiconductor devices such as LSIs can be stably fabricated with a resolution up to 1 μm or so and with high productivity.

The above and other objects, features and advantages of this invention will become apparent from the following description and the appended claims, taken in conjunction with the accompanying drawings.

BRIEF DESCRIPTION OF THE DRAWINGS

In the accompanying drawings

DETAILED DESCRIPTION OF THE INVENTION AND PREFERRED EMBODIMENT

With reference to the accompanying drawings, a preferred embodiment of this invention will hereinafter be described.

Figure 1:
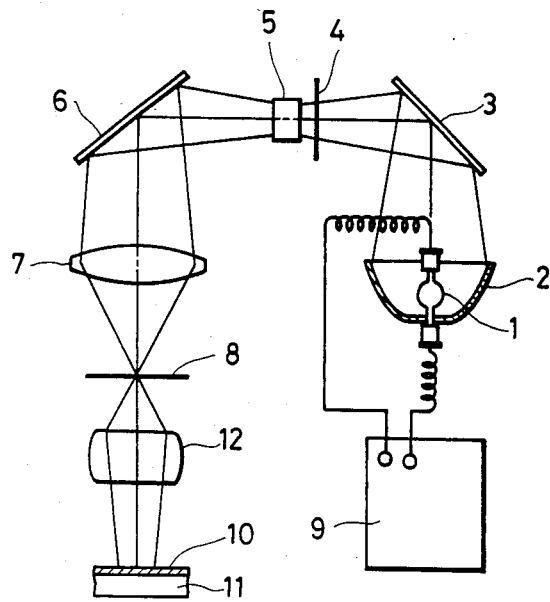
FIG. 1 is a schematic illustration of one example of an optical system useful in the practice of the process of this invention for the exposure of a semiconductor wafer.

Referring first to FIG. 1, numeral 1 indicates a short arc mercury vapor lamp in which mercury and a rare gas are enclosed in such amounts that the vapor pressure of mercury and the gas pressure of the rare gas reach 0.4–5 atms and 0.1–10 atms respectively. The discharge current of the mercury vapor lamp 1 is controlled at 10 A or higher by means of a drive power supply 9. This discharge may be caused by either a.c. lighting or d.c. lighting. As a further alternative, it may be caused by so-called superimposed lighting in which a large current is repeatedly and instantaneously superimposed during a steady radiation state operation by a low d.c. current. In superimposed lighting, it is necessary to control the average current per hour at a level not less than 10 A.

FIG. 1 also shows a light-focusing mirror 2, first plane mirror 3, shutter 4, integrator lens 5, second plane mirror 6 and condenser lens unit 7. At a suitable location on the optical path extending from the light-focusing mirror 2 to the condenser lens unit 7, a bandpass filter formed of an interference filter may be inserted if necessary. Designated at numeral 8 is patterns 8 which is in the form of a so-called photomask or reticle. These patterns 8 are reduced by a reducing lens 12 and then projected onto a photo-resist layer 10 on a semiconductor wafer 11. In other words, the light radiated from the short arc mercury vapor lamp 1 is irradiated onto the photoresist layer 10 through the patterns 8. Any suitable conventional photoresist may be used here.

Figure 6:
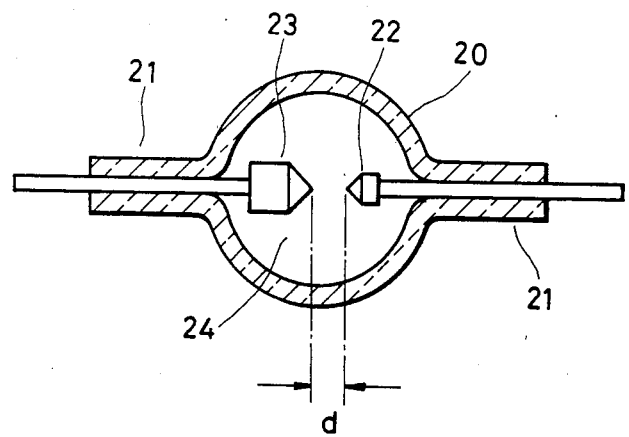
FIG. 6 is a simplified schematic cross-section of a short arc mercury vapor lamp.

Referring next to FIG. 6, there are shown a bulb 20, sealed portions 21, a cathode 22, an anode 23, and a cavity 24 formed in the bulb 20. Letter d indicates the interelectrode distance.

Figure 2:
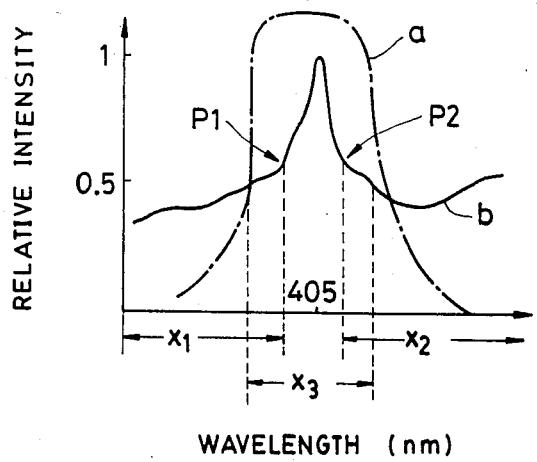
FIG. 2 diagrammatically illustrates the pulse width at half maximum of the spectrum of a light, which has a wavelength of 405 nm and is employed in a conventional process.
Figure 3:
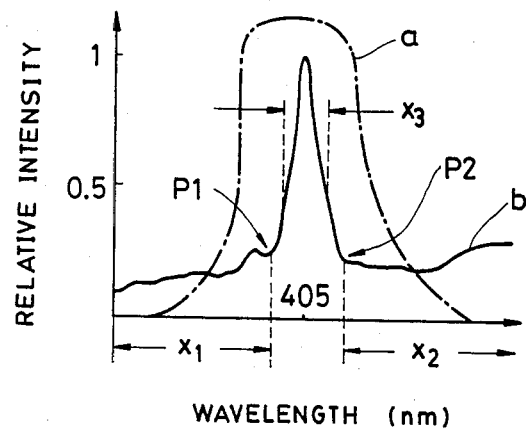
FIG. 3 diagrammatically illustrates the pulse width at half maximum of the spectrum of the light, which has a wavelength of 405 nm and is employed in the process of this invention.

Incidentally, the wavelengths of radiation caused by mercury discharge under certain typical conditions have generally been known. Light with either one or both wavelengths of 405 nm and 436 nm, which is given off from a conventional short arc mercury vapor lamp, has a spectrum featuring a broad pulse width at half maximum. Its spectrum is now described with reference to FIG. 2, in which wavelengths (nm) are plotted along the axis of abscissas while relative intensities are plotted along the axis of ordinates. Taking the wavelength of 405 nm by way of example, Curve a indicates a spectrum of wavelengths transmitted through a bandpass filter whereas Curve b represents a spectrum of wavelengths radiated from a conventional short arc mercury vapor lamp. A wavelength range $x_1$ below the rising point P1 of the peak of the wavelength of 405 nm and another wavelength range $x_2$ above the falling point P2 of the peak of the wavelength of 405 nm overlap the wavelength range $x_3$ corresponding to the effective pulse width at half maximum. As one of reasons for this overlapping, it is mentioned that the effective pulse width at half maximum is relatively broad, for example, as broad as 3 nm. When a short ark mercury vapor lamp with mercury and a rare gas enclosed therein in such amounts that the vapor pressure of mercury and the gas pressure of the rare gas reach 4 atms and 0.1–10 atms upon discharge lighting is lit at a discharge current of 28 A (d.c.) and a voltage of 38 V under control to operate same without reducing the intensity of radiation significantly compared with the intensity of conventional radiation, the intensity of light between the ranges $x_1$ and $x_2$ becomes smaller relative to the corresponding peak value as depicted in FIG. 3 and coupled with the reduced width of spectrum itself at 405 nm, the effective pulse width $x_3$ at half maximum can be reduced to 1.5 nm. Accordingly, the designing of lenses of an optical system can be facilitated and at the same time, the danger of breakdown can also be lessened owing to the reduced vapor pressure.

Figure 4:
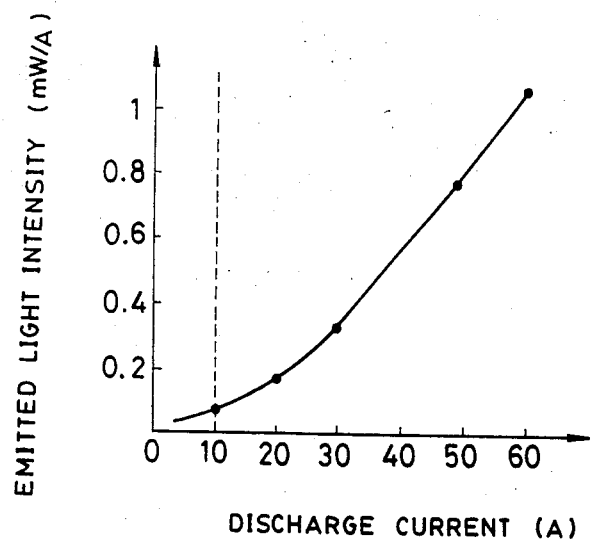
FIG. 4 is a diagrammatic representation of the intensities of light emitted from a short arc mercury vapor lamp as a function of discharge current.
Figure 5:
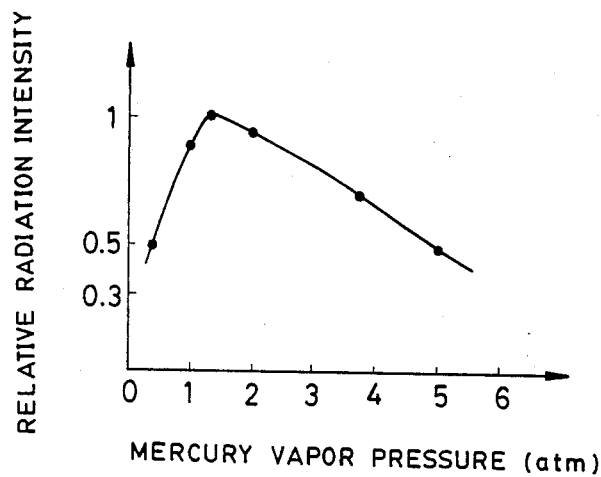
FIG. 5 is a diagrammatic representation of the intensities of radiation from a short arc mercury vapor lamp as a function of mercury vapor pressure during lighting of the short arc mercury vapor lamp.

As illustrated in FIG. 4, the intensity of radiation with the wavelength of 405 nm varies when the value of discharge current is changed. Discharge current levels (unit: A) are plotted along the axis of abscissas while the intensities (unit: mW/A) of the wavelength of 405 nm per unit current are plotted along the axis of ordinates. It is understood from this diagram that an intensity useful for the exposure of semiconductor wafers can be obtained when a discharge is caused to occur at a discharge current of 10 A or higher. By the way, the intensities plotted along the axis of abscissas were each determined by lighting the above short arc mercury vapor lamp in its upright position and then measuring the energy per cm$^2$ received at a point 1 m apart in the horizontal direction from the mercury vapor lamp. As shown in FIG. 5 in which the intensities of radiation from a short arc mercury vapor lamp are plotted as a function of the pressure of mercury upon discharge of the mercury vapor lamp, mercury pressures (atms) during lighting are plotted along the axis of abscissas while relative values of radiation intensities of light with the wavelength of 405 nm are plotted along the axis of ordinates. In FIG. 5, the curve has a peak of radiation intensity at 1.3 atms. Intensities of radiation are represented as relative values by supposing that the radiation intensity corresponding to the peak be 1.

In general, the wavelength width and peak intensity of the spectrum of a short arc mercury vapor lamp vary depending on the pressure of mercury vapor. They however do not change significantly and assure sufficient utility, so long as the pressure of mercury vapor during lighting, corresponding to the one half of the peak value in the diagram, falls within the range of from 0.4 atm to 5 atms. This applies equally to light with a wavelength of 436 nm. Curves similar to those shown in FIGS. 4 and 5 are hence obtained. A comparison however indicates that as to the intensity of radiation relative to the pressure of mercury vapor, the intensity of light with the wavelength of 436 nm is about 1.5 times that of light with the wavelength of 405 nm in the pressure range of 0.4–5 atms.

In a short arc mercury vapor lamp useful in the practice of this invention, the pressure of a rare gas enclosed therein such as argon or xenon may range from 0.01–10 atms. It is preferable to use a lower pressure as the pressure of such a rare gas, because if the pressure is too high, the width of the spectrum is broadened and use of such a high pressure becomes a cause for breakdown of the mercury vapor lamp. In this context, the pressure of the enclosed rare gas may preferably be 10 atms or lower in terms of the pressure during lighting. Use of this pressure range is also convenient since the shape of the curve shown in FIG. 5 is not substantially affected by the type and pressure of each rare gas in the pressure range up to 10 atms. Further, the interelectrode distance may preferably be 15 mm or shorter in order to maintain the nature of a "point light source".

When the exposure of a semiconductor wafer is carried out by a discharge controlled in the above-described manner, the exposure can be performed with a resolution up to 1.0 μm if the numerical aperture of a reducing lens is set at 0.40 and light with a wavelength of 405 nm is employed. The exposure time may be reduced to a period as short as 0.2 second. Therefore, the process of this invention assures sufficient and practical productivity.

Having now fully described the invention, it will be apparent to one of ordinary skill in the art that many changes and modifications can be made thereto without departing from the spirit or scope of the invention as set forth herein.

What is claimed is:

1. A process for the exposure of a semiconductor wafer, which comprises:
   (a) arranging a combination of electrodes in an opposed relation with an interelectrode distance of not more than 15 mm in a closed discharge cavity;
   (b) enclosing, within the cavity, mercury as a light-emitting discharge component in an amount such that the vapor pressure of mercury reaches 0.4–5 atms and a rate gas in an amount such that the vapor pressure of the rare gas reaches 0.1–10 atms during discharge lighting;
   (c) forming a discharge between the combination of electrodes while controlling the discharge current at an average current of 10 A or higher; and
   (d) irradiating light, which has been radiated as a result of the discharge and contains at least one of light components having wavelengths of 405 nm and 436 nm respectively, onto the surface of a photoresist applied on the semiconductor wafer through a photomask or reticle and a lens which permits transmission of the light having a wavelength of 405 nm or 436 nm therethrough, whereby the intensity of the light produced at 405 nm or 436 nm exhibits a narrow effective pulse width at half maximum in order to provide a resolution of up to 1.0 micro meters.

2. A process for the exposure of a semiconductor wafer as defined by claim 1, wherein said rare gas comprises argon.

3. A process for the exposure of a semiconductor wafer as defined by claim 1, wherein said rare gas comprises xenon.

* * * * *

UNITED STATES PATENT AND TRADEMARK OFFICE
CERTIFICATE OF CORRECTION

PATENT NO. : 4,704,346

DATED : November 3, 1987

INVENTOR(S) : Tatsumi Hiramoto et al

It is certified that error appears in the above-identified patent and that said Letters Patent is hereby corrected as shown below:

Column 4, line 57, change "rate" to --rare--.

Signed and Sealed this

Twenty-eighth Day of March, 1989

Attest:

DONALD J. QUIGG

Attesting Officer

Commissioner of Patents and Trademarks